United States Patent
Amirtharajah et al.

(10) Patent No.: US 7,199,681 B2
(45) Date of Patent: Apr. 3, 2007

(54) INTERCONNECTING OF DIGITAL DEVICES

(75) Inventors: Rajeevan Amirtharajah, Providence, RI (US); John R. Benham, Westborough, MA (US); John L. Critchlow, Northborough, MA (US); Thomas D. Simon, Marlborough, MA (US); Mark E. Naylor, Franklin, MA (US)

(73) Assignee: Intel Corporation, Santa Clara, CA (US)

( * ) Notice: Subject to any disclaimer, the term of this patent is extended or adjusted under 35 U.S.C. 154(b) by 681 days.

(21) Appl. No.: 10/126,754

(22) Filed: Apr. 19, 2002

(65) Prior Publication Data

US 2003/0200346 A1 Oct. 23, 2003

(51) Int. Cl.
*H03H 7/38* (2006.01)

(52) U.S. Cl. .......................................... 333/130; 333/33
(58) Field of Classification Search ............... 333/130, 333/32, 33
See application file for complete search history.

(56) References Cited

U.S. PATENT DOCUMENTS

| | | | | |
|---|---|---|---|---|
| 2,148,098 A | * | 2/1939 | Bowman-Manifold | ...... 333/130 |
| 3,701,056 A | * | 10/1972 | Ozawa et al. | ................ 333/130 |
| 4,251,224 A | * | 2/1981 | Cowley et al. | ............. 423/477 |
| 4,721,929 A | * | 1/1988 | Schnetzer | .................... 333/127 |
| 5,530,722 A | * | 6/1996 | Dent | ........................... 375/298 |
| 6,275,062 B1 | | 8/2001 | Starr | |
| 6,437,656 B1 | * | 8/2002 | Guynn et al. | ............. 333/24 R |
| 6,452,420 B1 | * | 9/2002 | Wong | ........................... 326/86 |
| 6,643,924 B2 | * | 11/2003 | Hirabayashi | ................. 29/846 |
| 6,790,114 B2 | * | 9/2004 | Derraa | .......................... 445/24 |

OTHER PUBLICATIONS

Internation Application No.: PCT/US03/10319; PCT Written Opinion dated Feb. 15, 2006.

* cited by examiner

*Primary Examiner*—Robert Pascal
*Assistant Examiner*—Kimberly E Glenn
(74) *Attorney, Agent, or Firm*—Blakely, Sokoloff, Taylor & Zafman LLP

(57) ABSTRACT

In some embodiments, a first conducting line, having a characteristic impedance, connects to a digital device while a second conducting line, also having a characteristic impedance, connects to another digital device. An impedance pathway connects the two conducting lines and has an impedance of at least one-third of the first conducting line's characteristic impedance and of at least one-third of the second conducting line's characteristic impedances. Other embodiments are claimed.

36 Claims, 13 Drawing Sheets

(a)

(b)

INTERCONNECTING OF DIGITAL DEVICES

TECHNICAL FIELD

This invention relates to interconnecting of digital devices.

BACKGROUND

Computers, for example, are commonly interconnected in networks such as wide area networks (WANs) and local area networks (LANs). Networks are also used at the circuit board level to allow central processing units (CPU's) to share information or communicate with each other. Although such CPUs are separated by relatively small distances, signal losses and reflections that occur on the transmission medium (e.g., conductive traces) can still be appreciable.

DETAILED DESCRIPTION

As will be described in greater detail below, digital devices may be connected by conducting lines and an impedance pathway. In general, a first conducting line connects to a first digital device, a second conducting line is connected to a second digital device, and an impedance pathway connects the first conducting line to the second conducting line. The impedance pathway has an impedance of at least one-third of the characteristic impedance of the first and second conducting lines. Among other advantages, by dedicating an impedance pathway to the conducting line-to-conducting line connection, signals can pass between the digital devices with reduced inter-symbol interference, compared to a direct connection, and reduced low frequency filtering as compared to electromagnetic coupling.

Figure 1:
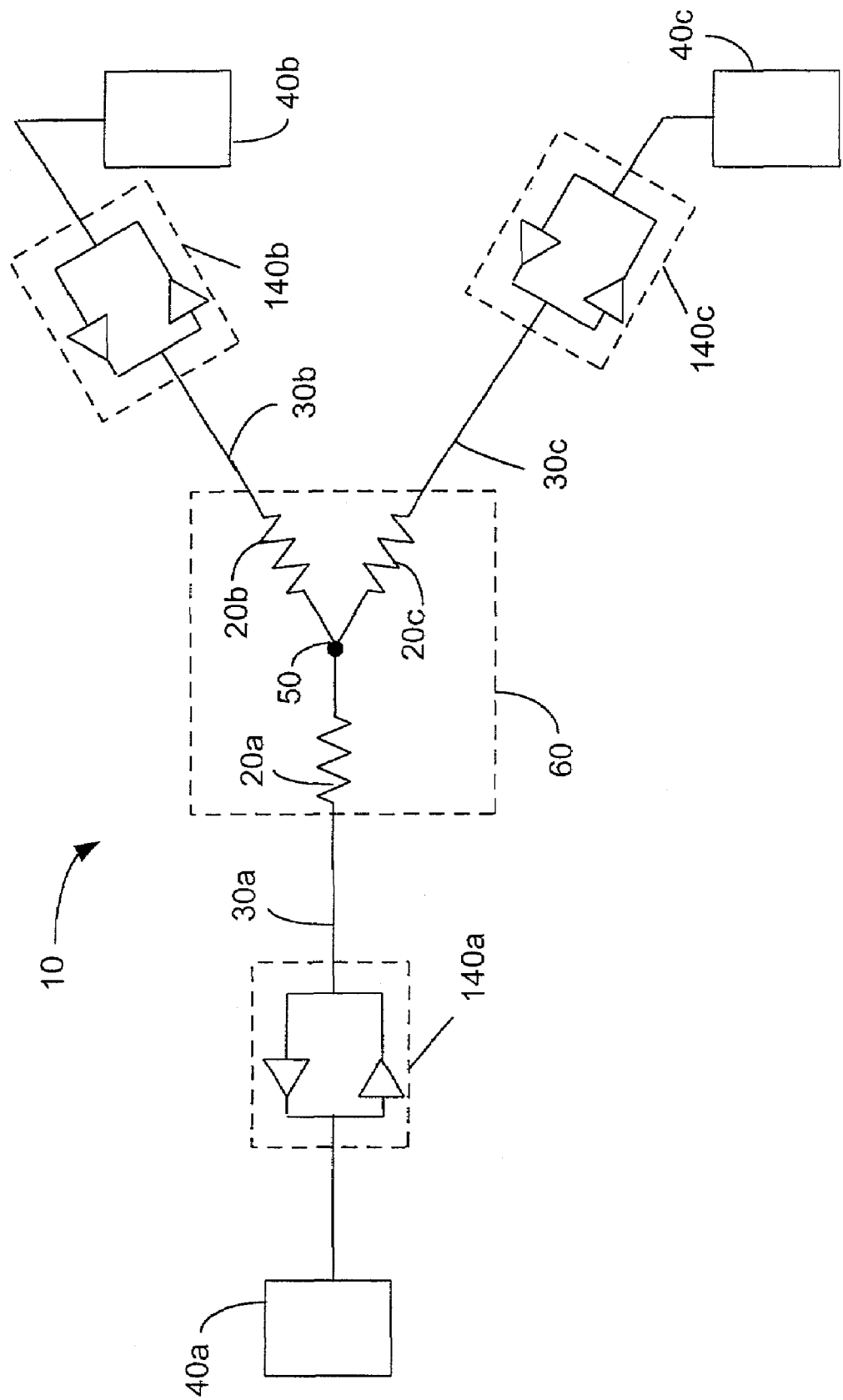
FIG. 1 illustrates a network including a 3-port Y-network.

Referring to FIG. 1, a network 10 includes three resistors 20a–c connected, at node 50, to form a Y-network 60 so that a signal, transmitted through any one of the resistors, has its energy equally split between the other two resistors. Resistors 20a and 20b connect conducting trace 30a to trace 30b, resistors 20b and 20c connect conducting trace 30b to trace 30c, and resistors 20a and 20c connect conducting trace 30a to trace 30c.

Three CPU's 40a–c, with respective transceivers 140a–c, are respectively connected to the three conducting trace s 30a–c. By choosing equal resistances for resistors 20a–c, a signal broadcast by one CPU will equally split between the other two CPU's. For example, if CPU 40a transmits a signal through conducting trace 30a, via transceiver 140a, and into resistor 20a, the signal splits equally between resistor 20b and 20c before being received at CPU's 40b and 40c. Due to the equal resistances, for the resistors 20a–c, bilaterally symmetric communication is provided to the CPU's 40a–c. Input impedance of transceivers 140a–c match (equal) the impedance of the respective conducting trace 30a–c when receiving a signal.

Maximum signal power is transferred between the resistors 20a–c by matching the characteristic impedance, $Z_0$, of conducting traces 30a–c. To match the characteristic impedance, the resistance, R, for each of the resistors 20a–c, is determined from the relationship, $$R = \left(\frac{N-2}{N}\right) \times Z_0,$$

where N is the number of CPU's, and also the number of resistors, connected to the Y-network 60. Thus, each of the three resistors 20a–c in Y-network 60 may have a resistance of at least one-third of $Z_0$, and each resistance may increase as more CPU's are connected to the Y-network 60. By matching the impedance of the conducting traces 30a–c, reflections are reduced between the conducting traces and the resistors 20a–c thereby reducing symbol interference of propagating signals.

Resistors 20a–c are passive devices and have frequency responses that include low frequencies (e.g., as low as 0 hertz). Thus, as a signal passes through each resistor, low frequency signal components pass and wider channel bandwidths are achieved compared to an electromagnetic coupler, which contribute to higher data transmission rates. In this example the Y-network 60 included three resistors, however as the number of CPU's connected to the Y-network increases, the number of resistors connected to the Y-network correspondingly increases.

Signals transmitted between the CPU's 40a–c contain symbols which encode bits. As the signals propagate within network 10, the signals are reflected at impedance discontinuities and cause intra-symbol and inter-symbol interference which degrades signal-to-noise ratios. By choosing resistors 20a–c with resistances such that the nodal impedance at the input and output ports of network 60 are matched to the characteristic impedance of the conducting traces 30a–c, the reflections, due to these discontinuities, are reduced. Since the resistors 20a–c are not directional, signals are bilaterally and symmetrically attenuated in either direction through the resistors and reflections are reduced for signals traveling in either direction through the resistors.

Figure 2:
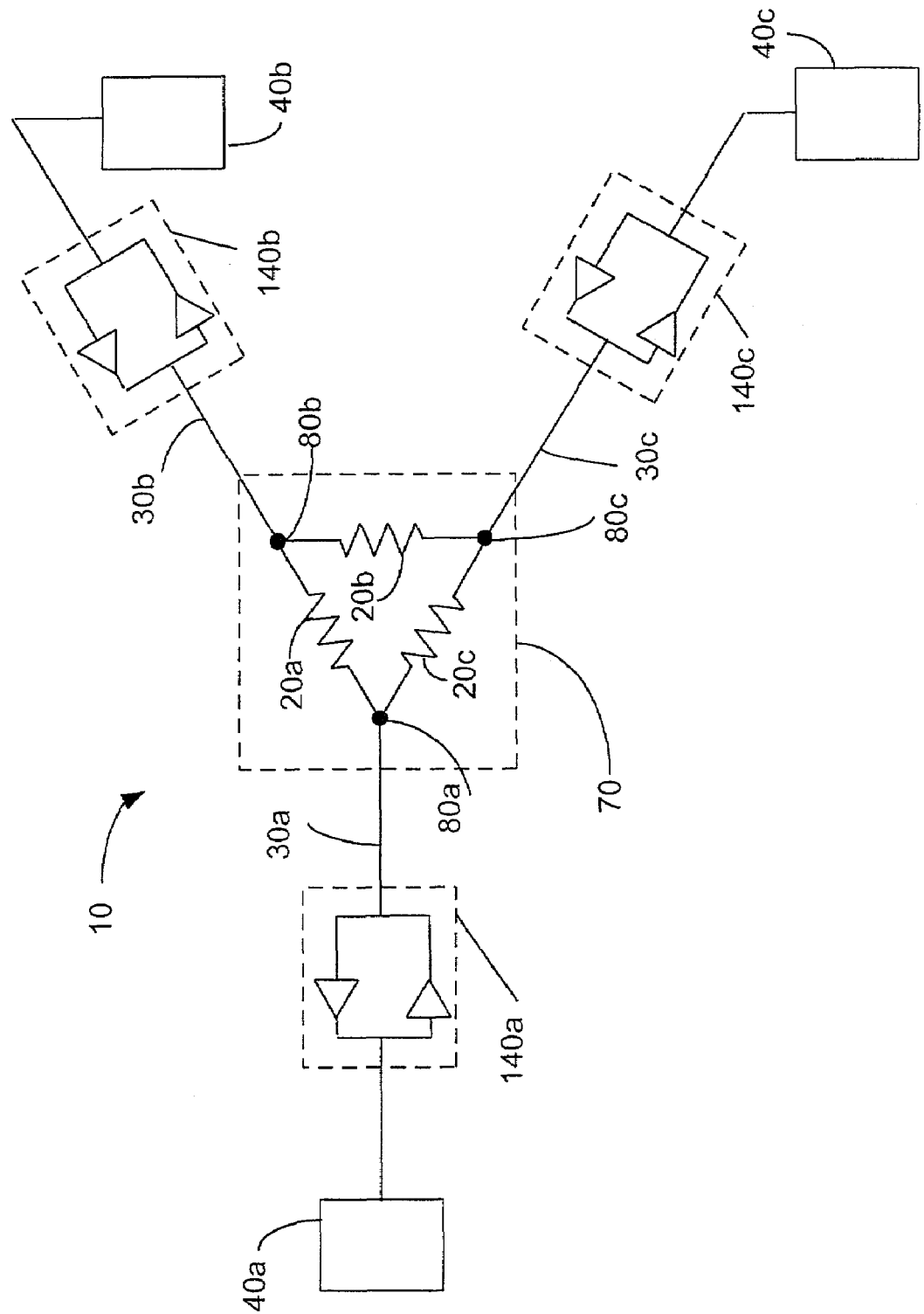
FIG. 2 illustrates a network including a 3-port delta-network.

Referring to FIG. 2, a delta-network 70 replaces the topologically equivalent Y-network 60, of FIG. 1, to form network 10. However, the architecture of the delta-network 70 dedicates a single resistor, as an impedance path, for each unique pair of conducting traces 30a–c. Resistor 20a connects conducting trace 30a to conducting trace 30b, resistor 20*b* connects conducting trace 30*b* to conducting trace 30*c*, and resistor 20*c* connects conducting trace 30*a* to conducting trace 30*c*.

By dedicating one resistor to each conducting trace-to-conducting trace connection, resistor parasitics are distributed throughout the delta-network 70. Resistor parasitics can be capacitive or inductive and are dependent on the packaging, positioning, and connecting of each resistor. Y-networks, as opposed to delta-networks, concentrate some resistor parasitics at a single node. For example, referring back to FIG. 1, each resistor 20*a–c* connects to node 50, allowing parasitics of each resistor to influence all signals transmitted through the node. Returning to FIG. 2, the delta-network 70, on the other hand, connects the resistors 20*a–c* with three nodes 80*a–c*, thereby distributing the influence of resistor parasitics. Thus, signals split by the delta-network 70 are subjected to parasitics dependent upon which node is transmitted across.

For example, when CPU 40*a* transmits a signal, via transceiver 140*a*, the signal is split at node 80*a* and propagates into resistors 20*a* and 20*c*. When CPU 40*b* receives the transmitted signal, via transceiver 140*b*, the signal is only influenced by the parasitics of the resistors connected to CPU 40*b*, in particular resistors 20*a* and 20*b*. Correspondingly, the signal received by CPU 40*c*, via transceiver 140*c*, is influenced by the parasitics of resistors 20*c* and 20*b*.

Similar to the Y-network of FIG. 1, resistors 20*a–c* of the delta network 70, shown in FIG. 2, have equal resistances, R, to provide equal splitting of transmitted signals and the characteristic impedance, $Z_0$, of the conducting traces 30*a–c* is matched to reduce symbol interference of the signals. However, R is now determined from the relationship, $$R=(N-2)\times Z_0,$$

where again N is the number of CPU's connected to the delta network 70. Thus, applying the relationship to the example shown in FIG. 2, each of the three resistors 20*a–c* in the delta network 70 have a resistance of $Z_0$, and each resistance may increase if the delta network 70 expands to connect more CPU's.

Figure 3:
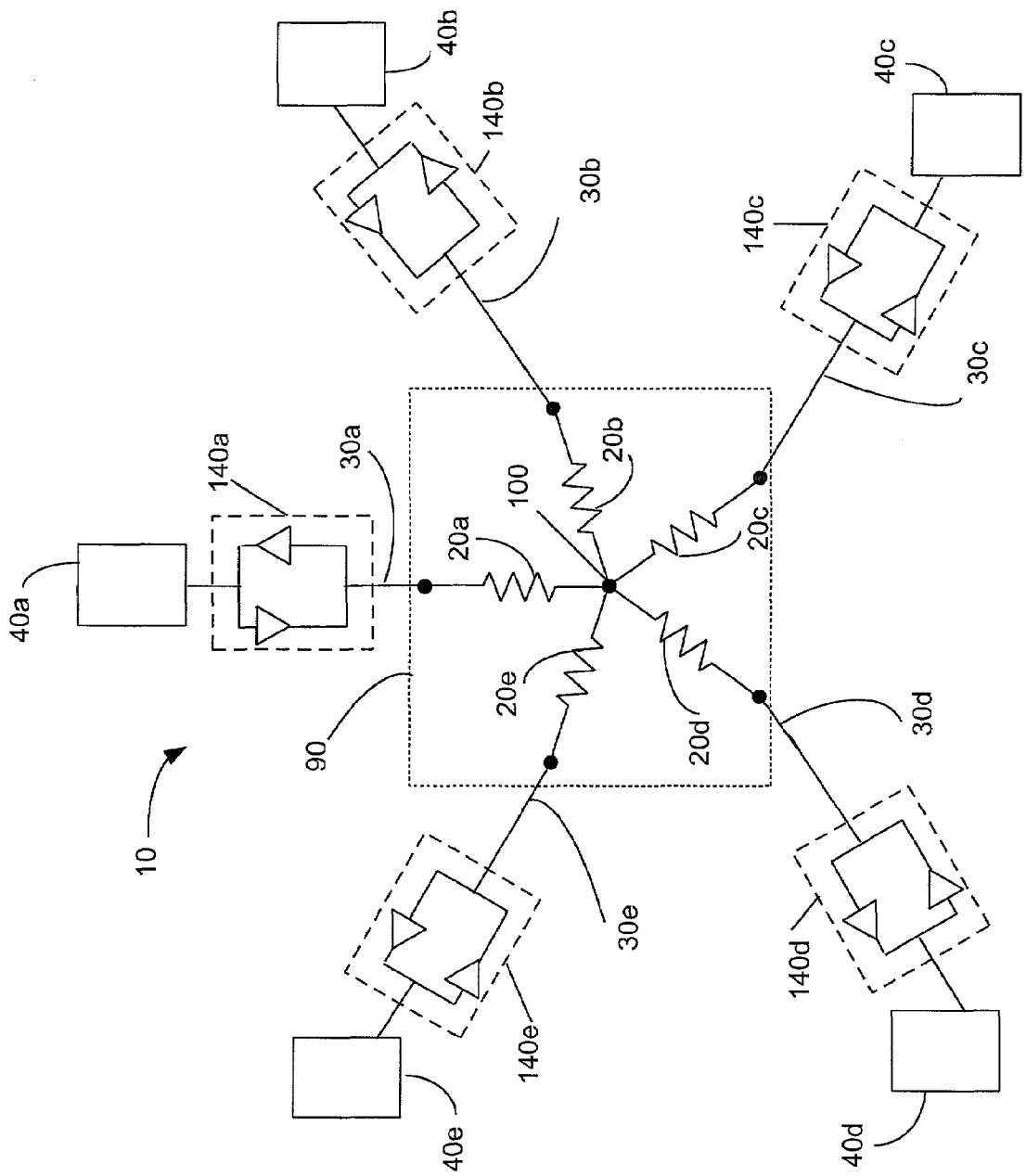
FIG. 3 illustrates a network including a 5-port star-network.

Referring to FIG. 3, a 5-port star-network 90, which is expanded from the Y-network 60 of FIG. 1, includes five resistors 20*a–e* that connect at node 100. The star network 90 allows five CPU's 40*a–e*, by way of respective transceiver 140*a–e*, to transmit signals among each other in a peer-to-peer communication topology, via conducting traces 30*a–e*. Again resistors 20*a–e* are chosen with equal resistance to split signals equally among the CPU's 40*a–e*, and the relationship associated with FIG. 1, is used to match the characteristic impedance of the conducting lines 30*a–e* to reduce symbol interference. The topology of the star-network 90 can be further expanded for any number of CPU's, however connecting more CPU's causes more signal splitting that reduces signal power and signal-to-noise ratio at the receiving CPU's. Also, although resistors 20*a–e* are chosen to equally distribute signal energy, as the number of resistors increases, corresponding to increasing the number of CPU's, resistor parasitics concentrated at node 100 will also increase. Depending on the implementation of the resistors 20*a–e*, this parasitic increase can set a practical limit to the number of CPU's that the star-network 90 can sustain.

Figure 4:
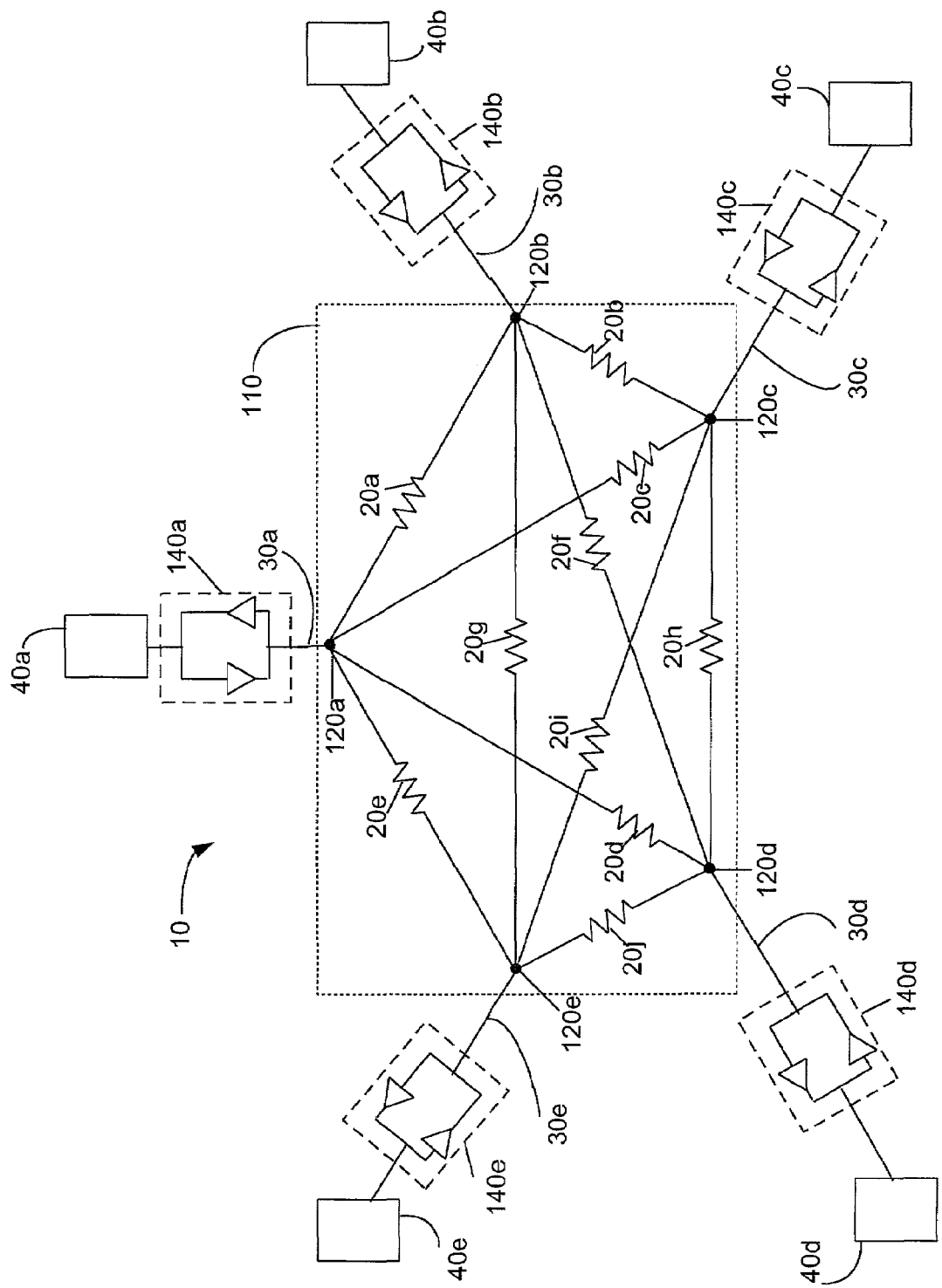
FIG. 4 illustrates a network including a 5-port delta-network.

Referring to FIG. 4, network 10 includes a delta-network 110 expanded to connect five CPU's 40*a–e*, along with respective transceivers 140*a–e*, for peer-to-peer communications. Ten resistors 20*a–j* are required to provide a dedicated resistor for each unique CPU-to-CPU connection, via conducting traces 30*a–e*. Referring briefly back to FIG. 3, only five resistors 20*a–e* were required in the star-network 90 to connect the five CPU's 40*a–e*. However, the parasitics of the resistors 20*a–e* are concentrated at the single node 100, while, returning to FIG. 4, the parasitics of the ten resistors 20*a–j* are distributed over five nodes 120*a–e*. Thus in this arrangement, the total number of resistors (E) required to connect a predetermined number of CPU's (N) in a delta-network is determined from the following relationship, $$E = \frac{N \times (N-1)}{2}.$$

As in the previous examples, resistors 20*a–j* are chosen to have equal resistance to provide equal signal energy splitting among the CPU's 40*a–e*. For example, if CPU 40*a* transmits a signal, via transceiver 140*a* and conducting trace 30*a*, the signal energy is equally split among resistors 20*a*, 20*c*, 20*d*, and 20*e*, to deliver equal signal portions to the CPU's 40*b*, 40*c*, 40*d*, and 40*e*. Also the resistance of the resistors 20*a–j* is determined from the same relationship associated with FIG. 2 in order to match the characteristic impedance of the conducting traces 30*a–e* and reduce symbol interference. However, as mentioned above, when increasing the number of CPU's connected to the delta-network 110, the received energy and the signal-to-noise ratio decreases at each of the receiving CPU's. Thus, expansion is not unlimited.

Figure 5:
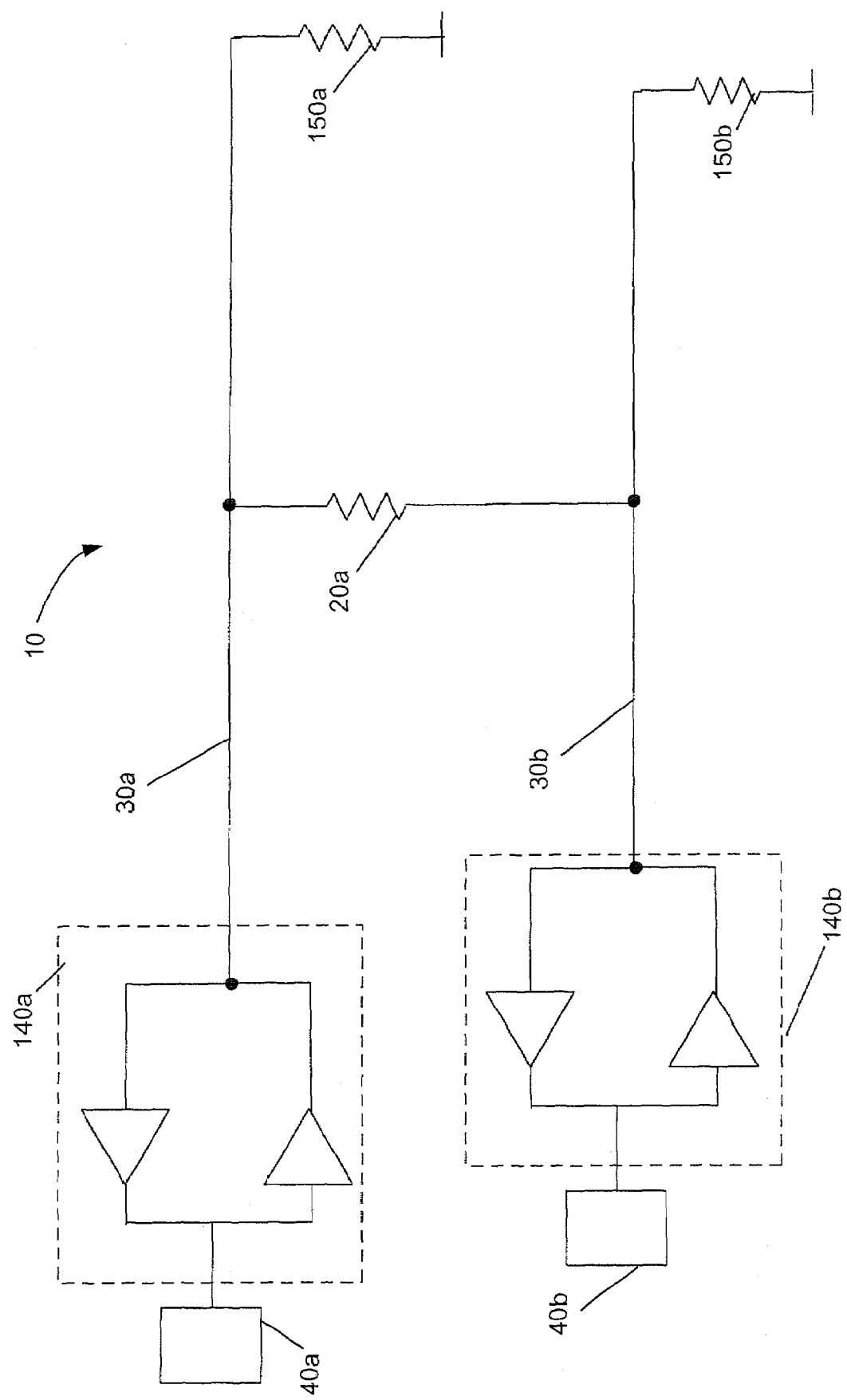
FIG. 5 illustrates a network including a tap resistor for connecting 2 CPU's.

Referring to FIG. 5, network 10 includes a resistor 20*a* that taps conducting traces 30*a* and 30*b* to pass propagating signals between the conducting traces. Unlike the Y-networks and delta-networks described above, which split signals among three or more conducting traces, only two conducting traces are connected by resistor 20*a*. By tapping the conducting traces 30*a* and 30*b*, CPU's 40*a* and 40*b* can transmit and receive signals between each other. Both conducting traces 30*a*, 30*b* have a characteristic impedance $Z_0$, and the resistance of the resistor 20*a* is very much larger than $Z_0$, for example five times as large. Thus only a small fraction of the signal energy is diverted from either conducting trace while not disturbing $Z_0$ of either conducting trace. However, parasitics may accompany the implementation of the resistor 20*a* and may degrade the integrity of signals passed between the two conducting traces 30*a*, 30*b*.

The network 10 also includes transceivers 140*a* and 140*b* which connect the CPU's 40*a*, 40*b* to the respective conducting traces 30*a*, 30*b*. The transceivers 140*a*, 140*b* also condition the signals transmitted or received by the CPU's 40*a*, 40*b* while the input impedance of the transceivers match the impedance of the conducting traces 30*a*, 30*b* when the transceivers receive signals. Terminating resistors 150*a*, 150*b* terminate the ends of each respective conducting trace 30*a*, 30*b* to reduce internal reflections. The terminating resistors 150*a*, 150*b* may have a resistance matched to $Z_0$.

Resistor 20*a* may be replaced by a conducting trace, implemented as a high impedance transmission line, to tap the two conducting traces 30*a*, 30*b* with the advantage that conducting traces typically have lower parasitics than resistors. However, the conducting trace must be electrically long to provide a characteristic impedance much larger than the characteristic impedance of the conducting traces 30*a*, 30*b*. At certain frequencies, this may require an impractical amount of area or may not be as cost-effective as a resistor. Alternatively, a lossy line whose series resistance is much greater than its series reactance may be used.

Figure 6:
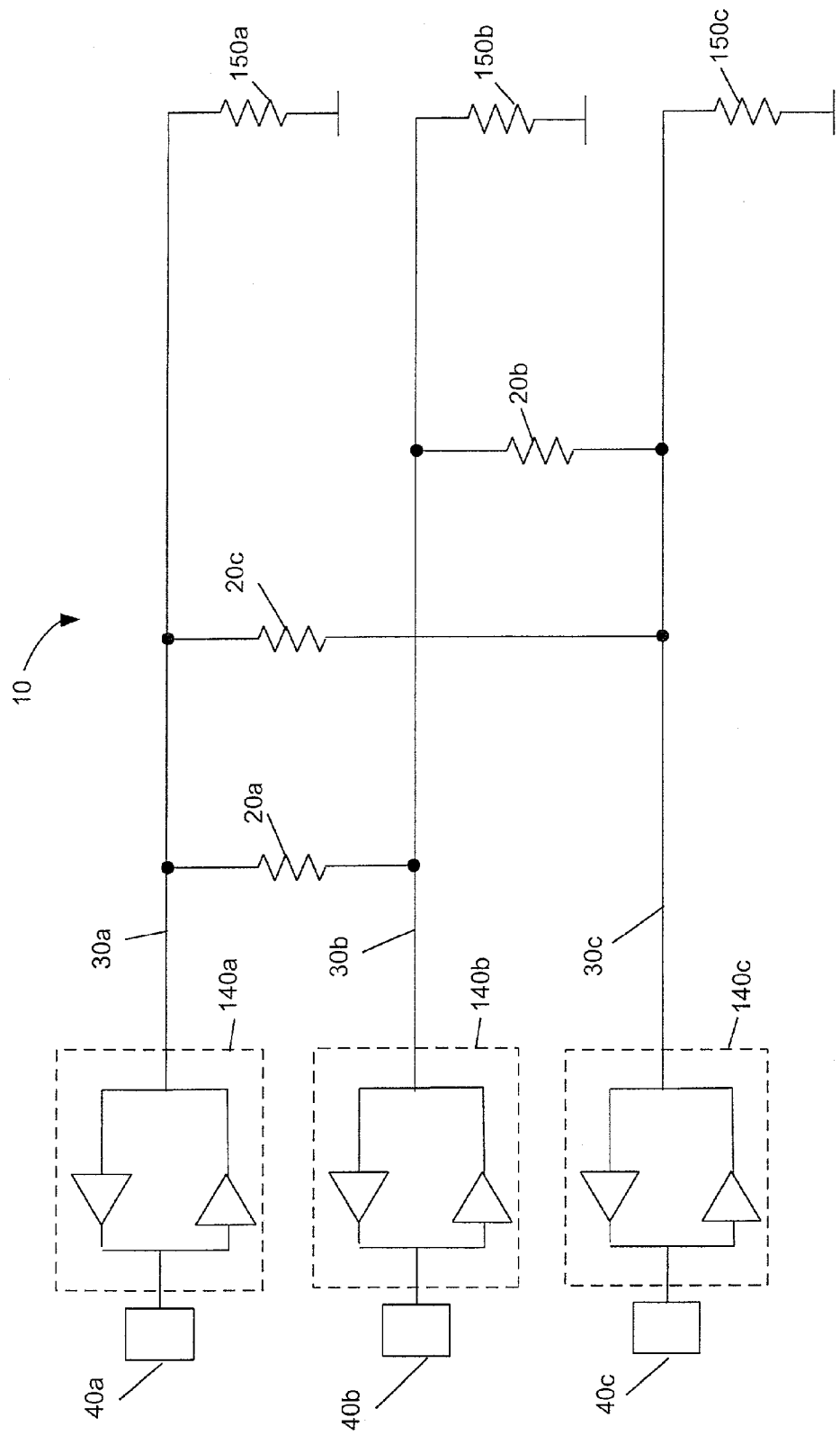
FIG. 6 illustrates a network including a tap resistor for connecting 3 CPU's.

Referring to FIG. 6, a network 10 expands to include three conducting traces 30a, 30b, 30c that are respectively tapped by three resistors 20a, 20b, 20c to connect each unique pair of conducting traces and provide a dedicated communication path for each corresponding unique pair of CPU's 40a, 40b, 40c. Each of the resistors 20a–c has a resistance that is much larger than the characteristic impedance of the conducting traces 30a–c, although each resistor may have a different resistance.

Resistor 20a connects conducting trace 30a to conducting trace 30b, providing a communication path between CPU 40a and 40b, resistor 20b connects conducting trace 30b to conducting trace 30c, providing a communication path between CPU 40b and 40c, and resistor 20c connects conducting trace 30a to conducting trace 30c, providing a communication path between CPU 40a and 40c. Also, similar to FIG. 5, network 10 includes transceivers 140a–c to condition signals transmitted from or received by the CPU's 40a–c and the transceivers provide an input impedance that matches the impedance of the conducting traces 30a–c when the transceivers are receiving signals. Terminating resistors 150a–c, each having a resistance matched to the characteristic impedance of the respective conducting traces 30a–c, reduce reflections by terminating each respective conducting trace 30a–c.

When one of the three CPU's 40a–c broadcasts a signal, through the respective transceiver 140a–c and onto the respective conducting trace 30a–c, the signal energy is tapped by the resistors connected to the trace. The signal energy then propagates onto the other conducting traces and is received by the other two CPU's. For example, if CPU 40a transmits a signal onto conducting trace 30a, via transceiver 140a, the signal energy is tapped by resistors 20a and 20c. Thus, a portion of the signal energy is transmitted onto conducting trace 30b and 30c. Once present on the other conducting traces 30b, 30c, the signal portions are received by CPU's 40b and 40c, via the respective transceivers 140b and 140c.

Figure 7:
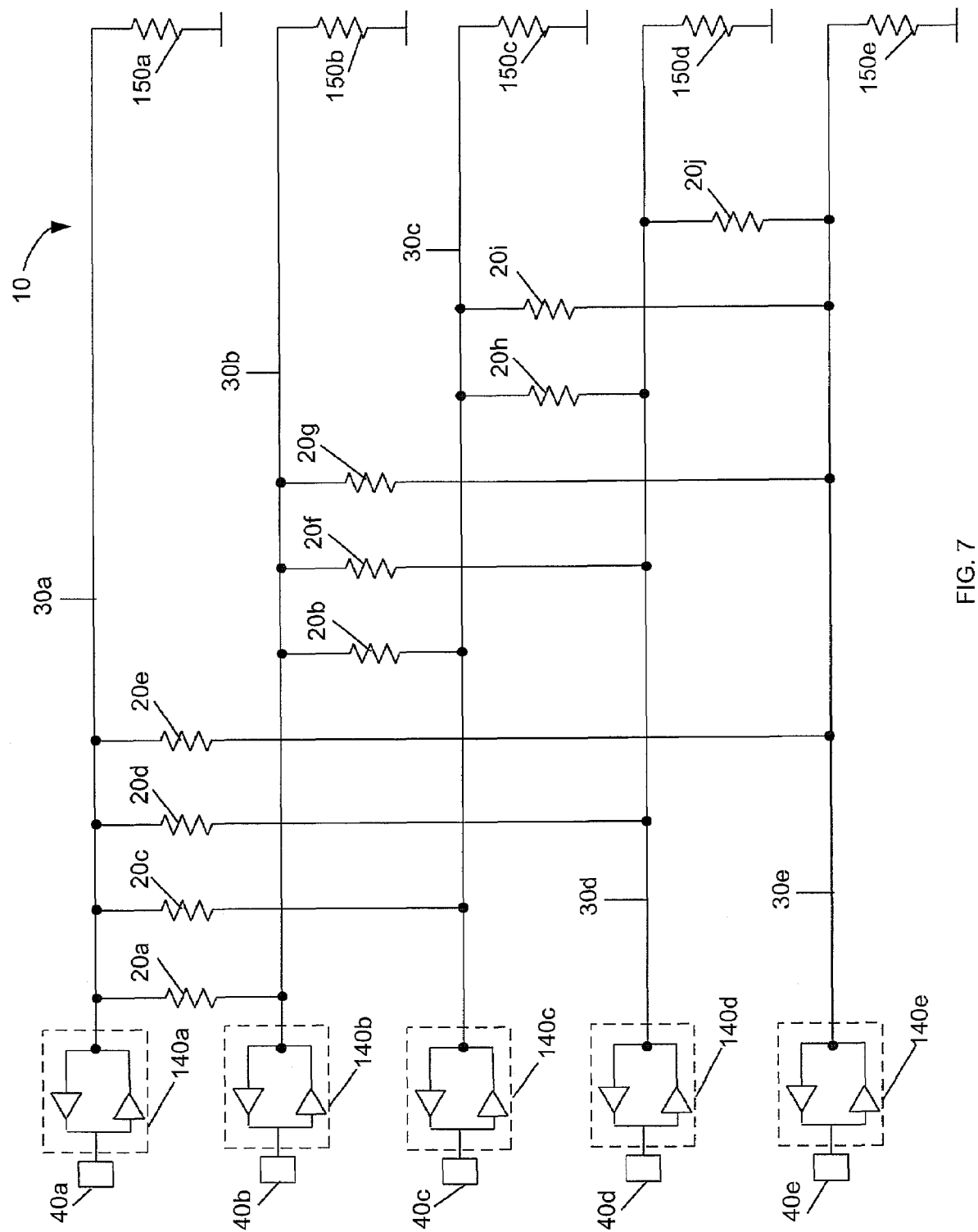
FIG. 7 illustrates a network including a tap resistor for connecting 5 CPU's.

Referring to FIG. 7, the network 10 is expanded to include five conducting traces 30a–e for bilaterally communicating between five CPU's 40a–e, which is equivalent to expanding the delta network 10 shown in FIG. 4. Again, the number of CPU's (N) connected to the network 10, requires (E) resistors to provide a dedicated communication path between each unique pair of CPU's as governed by the following relationship (reproduced from above), $$E = \frac{N \times (N-1)}{2}.$$

Also, as the number of CPU's connected to the network increases, the number of terminating resistors correspondingly increase. Conducting traces 30a–e are terminated with terminating resistors 150a–e to reduce signal reflections.

As mentioned above, the resistors 20a–j may or may not have equal resistances. Typically a resistor located closer to the corresponding connected pair of CPU's is implemented with a higher resistance than a resistor located further from the connected pair of CPU's. However, each resistance is still much larger than the characteristic impedance of the conducting traces 30a–e so only a small fraction of the transmitted signal is diverted to the other conducting traces. Since only a small fraction of the signal propagates through a particular resistor, if the resulting fractional signal is split by a second resistor, only an insignificant portion of the original signal may propagate through the second resistor and may be undetectable by the CPU's 40a–e.

By tapping the conducting traces 30a–e using the resistors 20a–j, each CPU can broadcast a signal to the other four CPU's. However, also mentioned above, excessive signal splitting decreases the signal-to-noise ratio at each receiving CPU and reduces the received energy, which may be below the receiving threshold of the CPU's.

Figure 8:
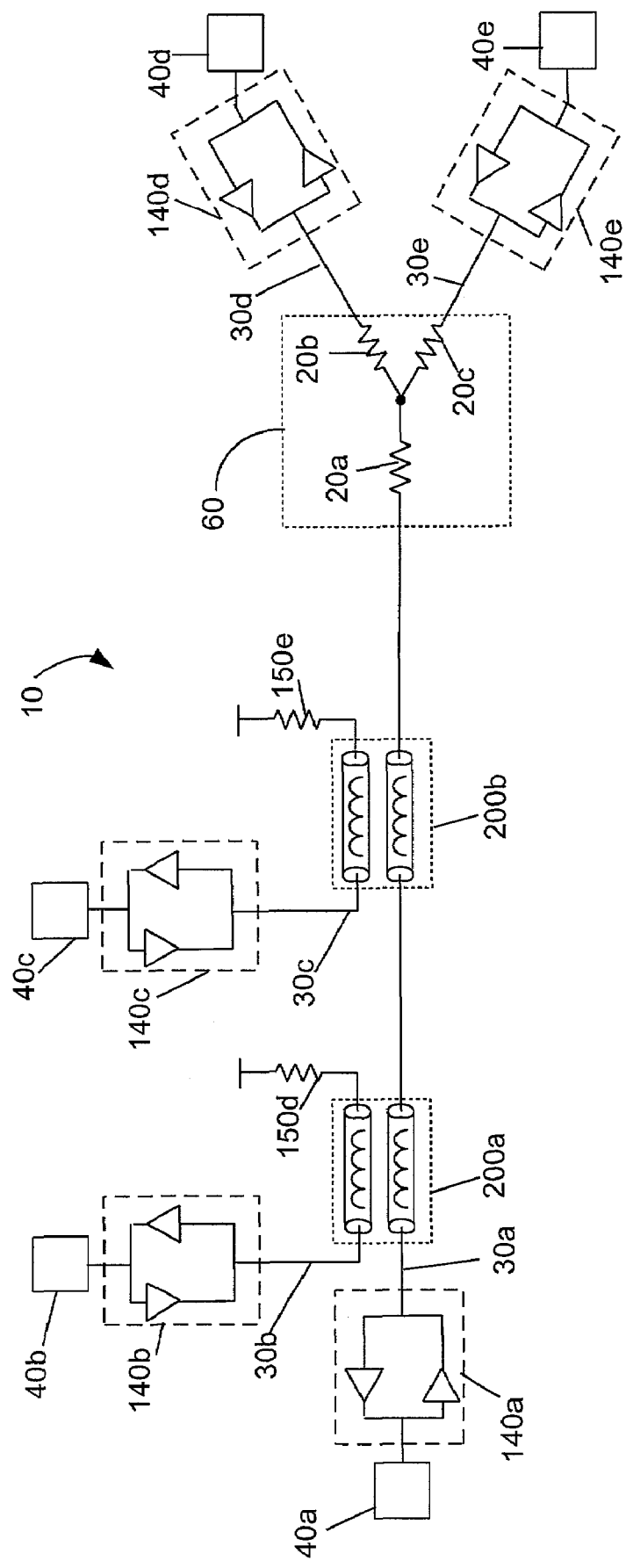
FIG. 8 illustrates a network including a 3-port Y-network and directional couplers.

Referring to FIG. 8, network 10 includes the Y-network 60 resistive power splitter, as shown in FIG. 1, and two couplers 200a, 200b for transmitting signals between CPU's 40a–e. In this example, CPU's 40b and 40c are electromagnetically coupled to a conducting trace 30a by couplers 200a and 200b while CPU's 40a, 40d, and 40e direct connect to the network 10 via the Y-network 60. Couplers 200a and 200b do not significantly impact the characteristic impedance of the conducting trace 30a since conducting traces 30b and 30c electromagnetically couple to conducting trace 30a and are not direct connected. Minimal reflections occur when the impedance seen at the couplers 200a and 200b is matched to the impedance of the characteristic impedance of the conducting traces 30a, 30b, and 30c.

Couplers 200a, 200b transmit signals onto the conducting trace 30a, however the couplers are directional devices and have frequency responses that filter low frequency components of signals. Couplers 200a, 200b have at least one advantage that parasitics from the components' packages and connectors are isolated from the coupled conducting trace 30a, while the resistors' 20a–c parasitics directly impact the connected conducting traces 30a, 30d, and 30e.

In this example, CPU 40a serves as the master CPU and assists transmissions between CPU 40b and 40c. Since CPU's 40b and 40c are coupled to conducting trace 30a, by separate couplers 200a, 200b, signals must couple across both couplers 200a, 200b for transmission between the two CPU's. However, due to low coupling coefficients and directivity of the couplers 200a, 200b, a signal coupling across two couplers may be reduced to an undetectable level. Thus, a signal originating at CPU 40b or 40c must first be transmitted to and re-transmitted from the master CPU 40a for sufficient signal magnitude to couple across the second coupler. For example, to transmit a signal from CPU 40b to 40c, CPU 40b transmits a signal through conducting trace 30b, via transceiver 140b, and into coupler 200a. The signal couples across coupler 200a and propagates onto conducting trace 30a and is received by master CPU 40a after conditioning by transceiver 140a. Master CPU 40a then re-transmits the signal back onto conducting trace 30a, via transceiver 140a, and the signal propagates through coupler 200a and into coupler 200b. The signal then couples across coupler 200b onto conducting trace 30c and is received by CPU 40c after signal conditioning by transceiver 140c. Transmitting a signal from CPU 40c to CPU 40b also may require transmitting to and re-transmitting from the master CPU 40a, however in a reversed manner.

Master CPU 40a may be configured to re-transmit various versions of the received signal. For example, master CPU 40a may transmit an amplified or filtered version of the received signal, or the master CPU 40a may re-transmit a replica waveform, of the original signal, after decoding the bits in the received signal.

CPU's 40d and 40e are connected to the network 10 with the Y-network 60 resistive power splitter, which includes resistors 20a–c. Similar to the Y-network 60 described in conjunction with FIG. 1, resistors 20a–c have equal resistances to provide equal signal splitting among the conducting traces 30a, 30d, and 30e. Thus, unlike the CPU's 40b and 40c, which are coupled to conducting trace 30a, CPU's 40a, 40d, and 40e may transmit signals directly to each other without any re-transmissions by the master CPU 40a.

For example, if CPU 40d transmits a signal into the Y-network 60, via transceiver 140d, conducting trace 30d, and resistor 20b, resistors 20a and 20c equally split the signal for receiving at CPU's 40a and 40e, via respective conducting traces 30a and 30e and transceivers 140a and 140e. Similar to the examples above, terminating resistors 150d, 150e connect to the couplers 200a, 200b to reduce internal reflections within the network 10. Network 10 can be expanded or contracted to include more or less couplers and resistive power splitters provided adequate signal-to-noise ratios are maintained within the operating bandwidth.

The resistive power splitters described in the previous examples can be physically implemented from discrete components or distributed resistive materials, which may be applied or laminated to circuit boards. The resistive power splitter layouts are flexible in arrangement and may be implemented in relatively small amounts of circuit board space. Additionally, layout schemes can reduce timing asymmetry among the various elements included in the resistive power splitters.

Figure 9:
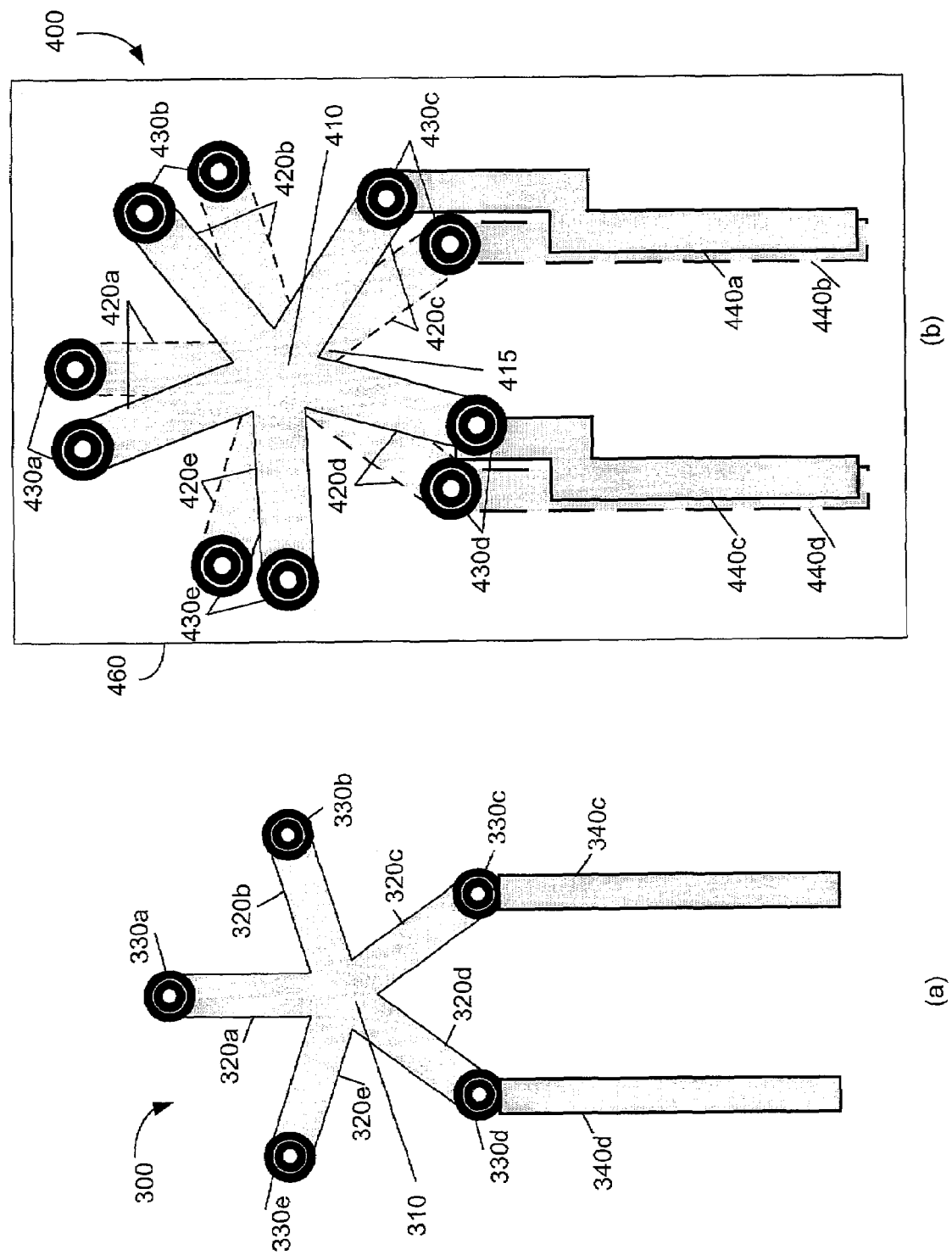
FIG. 9 illustrates a single-ended and differential star-network resistive power splitter.

Referring to FIGS. 9(a) and 9(b) a 5-port resistive power splitter is implemented as a single-ended resistive power splitter 300 and as a differential resistive power splitter 400. Briefly referring to FIG. 3, the single-ended 5-port star-network 90 resistive power splitter is shown schematically and allows peer-to-peer signal broadcasting between the five CPU's 40a–e. Returning to FIG. 9(a), the single-ended resistive power splitter 300 has a single layer of resistive material 310 in a star-pattern while the differential power splitter 400, shown in FIG. 9(b), implements two layers of star-patterned resistive material 410, 415 to form the resistor pairs for differential signals.

Each leg 320a–e of the single-ended resistive power splitter 300, and each pair of legs 420a–e of the differential resistive power splitter 400, correspond to the respective resistors 20a–e of the five port resistive power splitter 90 of FIG. 3. Returning to FIG. 9, each leg 320a–e, or pair of legs 420a–e, extends from the central point of the respective star-patterns to terminals 330a–e, for the single-ended resistive power splitter 300, or terminal pairs 430a–e, for the differential resistive power splitter 400. The terminals 330a–e and terminal pairs 430a–e may be configured to connect to conducting traces for access to external circuitry. For example, referring to FIG. 9(a), terminal 330c and 330d connect to conducting traces 340c and 340d and, referring to FIG. 9(b), terminal pairs 430c and 430d connect to conducting trace pairs 440a, 440b and 440c, 440d.

The legs 320a–e of the resistive power splitter 300 are symmetric in size and the pairs of legs 420a–e of the resistive power splitter are also symmetric in size so signals propagate in the same amount of time through each leg or each pair of legs. For example, referring to FIG. 9(a), a signal transmitted from terminal 320a to terminal 320b will have a propagation time equal to a signal transmitted from terminal 320a to terminal 320c. Similarly, referring to FIG. 9(b), a differential signal transmitted from differential terminal pair 430a will require the same propagation time to be received at each of the other differential terminal pairs 430b–e.

The two star-patterned layers of the resistive material 410, 415, implemented in the differential resistive power splitter 400, are electrically isolated by a dielectric material 460 to allow no current to pass between the two star-pattern layers. The pairs of individual conducting traces 440a, 440b and 440c, 440d, are located in close proximity and are also separated by the dielectric material 460 to allow broadside differential coupling. Similar to all the resistive power splitters mentioned above, the number of legs can be increased to provide more CPU network connections. Although separated by the dielectric material 460, each terminal pairs 430a–e may be accessible from either side of the dielectric material 460 (shown) or accessible from only one side of the dielectric material (not shown).

Referring to FIG. 10(a), a differential resistive power splitter 600 is schematically shown and includes discrete resistive components. The schematic circuit includes resistors 610a–f, which may have the same resistance to equally split differential signals among conducting traces 620a–f. Resistors 610a–f also connect to a pair of differential bus lines 630a, 630b so that a differential signal transmitted onto one pair of conducting traces will propagate though the respective pair of resistors and be placed on the bus lines 630a, 630b. Once on the bus lines 630a, 630b, the signal splits among the other resistor pairs and is received by the other conducting trace pairs. For example, a differential signal transmitted onto conducting trace pair 620a and 620b propagates through resistors 610a and 610b and onto the bus lines 630a and 630b. The signal splits between the other resistor pairs 610c, 610d and 610e, 610f and is received on the other conducting trace pairs 620c, 620d and 620e, 620f.

In this arrangement there is less symmetry, as compared to the star-pattern arrangement of FIGS. 9(a) and (b), and propagation times between the terminal pairs will vary. For example, the time for a differential signal to transmit from conducting trace pair 620a and 620b to conducting trace pair 620c and 620d is shorter than the time to transmit from conducting trace pair 620a and 620b to conducting trace pair 620e and 620f due to the different propagation distances along the bus lines 630a, 630b.

Because all of the components are on a single layer, this physical layout causes the different propagation delays. However, this layout has the advantage that components may cost less to fabricate than other types of resistive power splitters. Although the resistive power splitter 600 is shown here for splitting differential signals, the splitter may also be implemented to split single-ended signals.

Referring to FIG. 10(b), a physical layout of the resistor power splitter 600 is implemented on one layer and uses standard discrete surface-mounted resistor components. As described in conjunction with FIG. 10(a), pairs of conducting traces 620a–f receive differential signals and transmit the signals to the differential bus lines 630a, 630b, via resistors 610a–f. Once on the differential bus lines 630a, 630b, the differential signal energy is split between the other resistors and the signal propagates to the other pairs of conducting traces. For example, a differential signal transmitted onto the pair of conducting traces 620a and 620b propagates through the respective resistor pair 610a, 610b and onto the differential bus lines 630a, 630b. The differential signal then splits between the other two pairs of discrete resistors 610c, 610d, and 610e, 610f and propagates through the other pairs of conducting traces 620c, 620d and 620e, 620f which may pass the signal to other circuitry. The resistive power splitter 600, as shown in FIGS. 10(a) and 10(b) may be expanded to include additional conducting traces and resistors connected to the differential bus lines 630a, 630b.

By extending bus line 630b beneath the resistors 610b, 610d, and 610f, the resistive power splitter 600 may be implemented on one layer, thereby reducing multi-layer connections and bus line 630*a*, 630*b* lengths. By reducing the bus line 630*a*, 630*b* lengths, parasitics are reduced along with time delay mismatches.

The differential signaling benefits are also exploited by routing the bus lines 630*a*, 630*b* in close proximity to allow for co-planar edge coupled bus lines. The differential resistive power splitter 600, can also be implemented for single-ended signals by replacing the pairs of conducting traces with single conducting traces, along with a single discrete resistor for each pair of discrete resistors and one bus line instead of the pair of bus lines.

Figure 10:
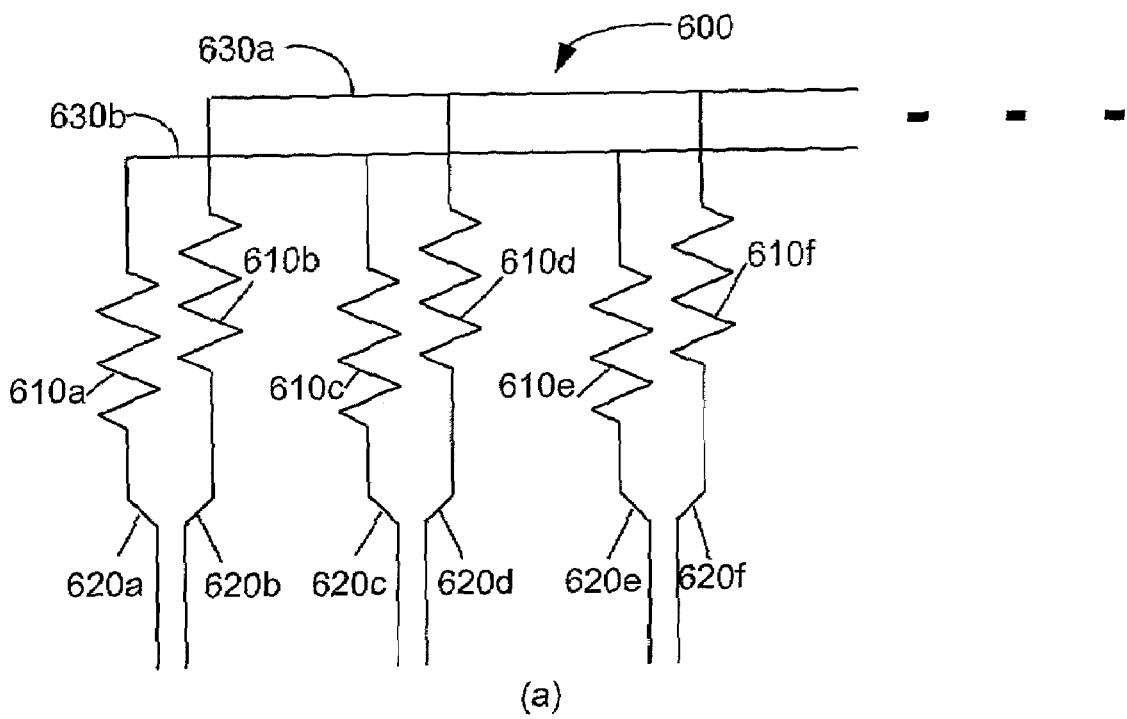
FIG. 10 illustrates another embodiment of a differential star-network resistive power splitter.
Figure 10:
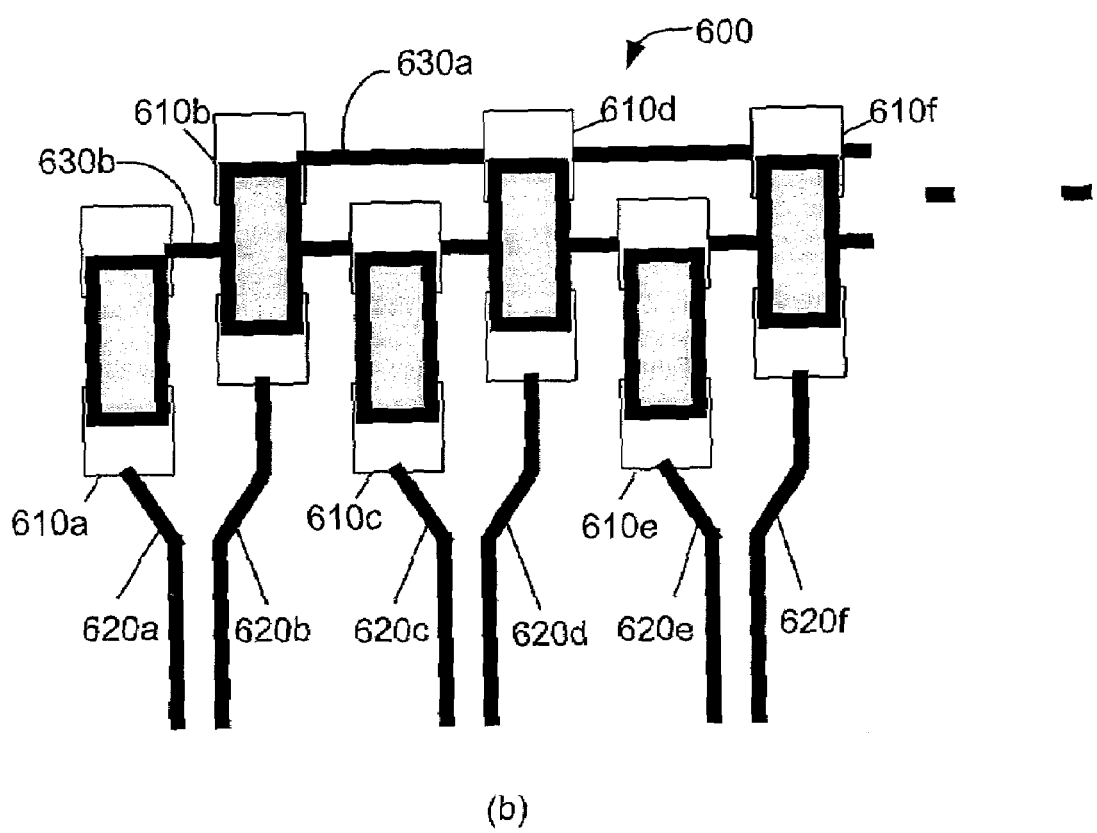
Figure 11:
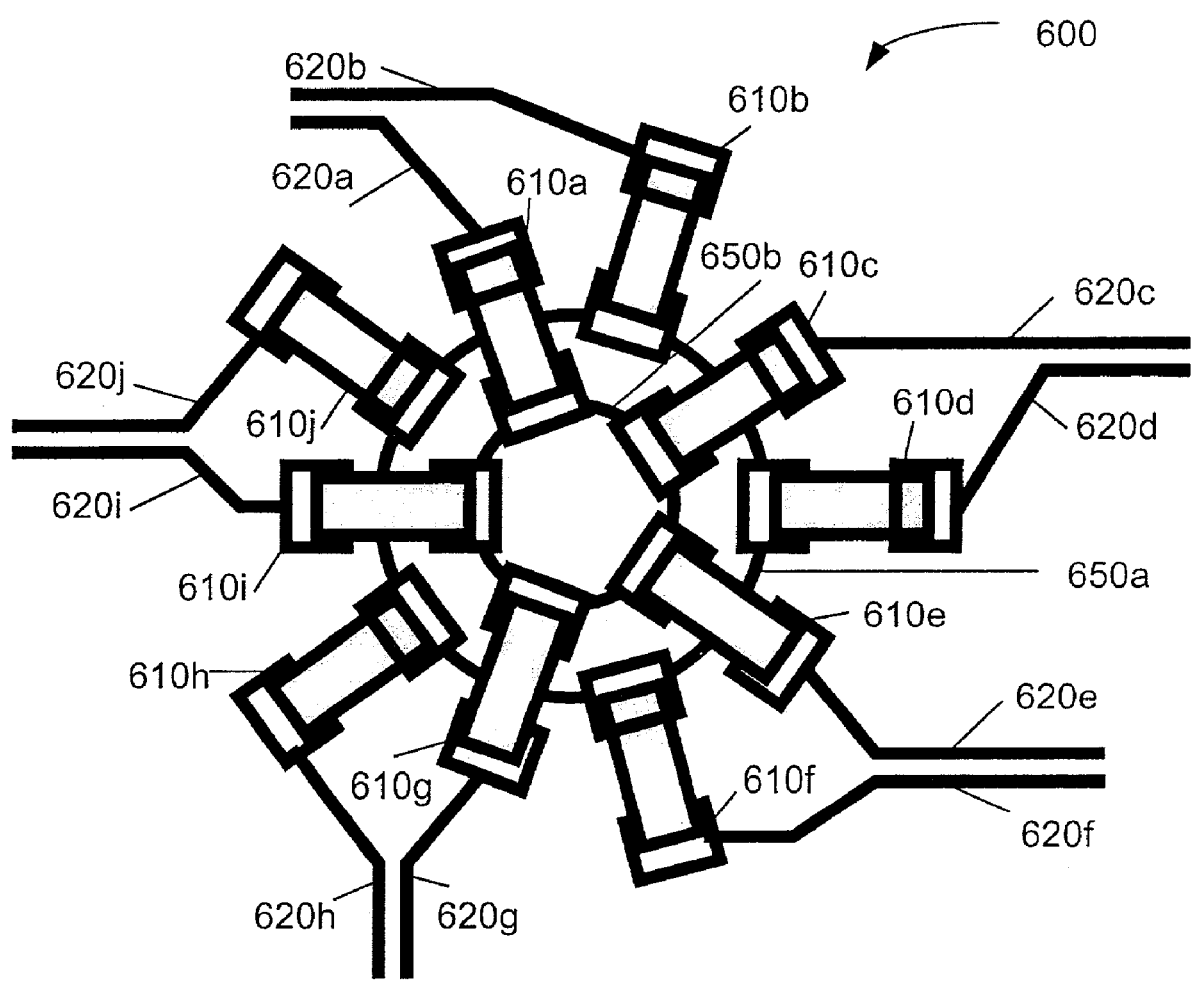
FIG. 11 illustrates another embodiment of a differential star-network resistive power splitter.

Referring to FIG. 11, resistive power splitter 600 implements a circular geometry to reduce propagation time variations through the impedance paths. The resistive power splitter 600 includes resistors 610*a–j* and conducting traces 620*a–j*, which are similar to the resistors and conducting traces shown in FIG. 10(*b*). However this physical implementation reduces the asymmetrical paths between the resistors by replacing the bus lines 630*a*, 630*b* with stacked circular conductors 650*a*, 650*b*.

In this example, each of the five pairs of conducting traces 620*a*, 620*b* and 620*c*, 620*d* and 620*e*, 620*f* and 620*g*, 620*h* and 620*i*, 620*j* may receive a differential signal which propagates through the respective pair of discrete resistors and onto the circular conductors 650*a*, 650*b*. The differential signal splits among the other pairs of discrete resistors 610*a–j* and propagates onto the other pairs of conducting traces 620*a–j*.

Due to the symmetrical shape of the circular conductors 650*a*, 650*b*, time delay variations may be reduced for a differential signal propagating from one pair of conducting traces to the other pairs of conducting traces as compared to the implementation of FIG. 10. This physical layout also has the advantage that the conducting traces, which comprise each pair of conducting traces 620*a*, 620*b* and 620*c*, 620*d* and 620*e*, 620*f* and 620*g*, 620*h* and 620*i*, 620*j*, are in close proximity and may improve differential signaling.

Although the circular conductors 650*a*, 650*b* have a circular geometry, other closed-shape conductors may also be used to reduce the propagation time differences. For example, regular polygons such as equilateral triangles or squares may balance the delays. In general, to obtain maximum bandwidth the perimeter of the closed shape may be electrically short at the highest frequency of interest.

Figure 12:
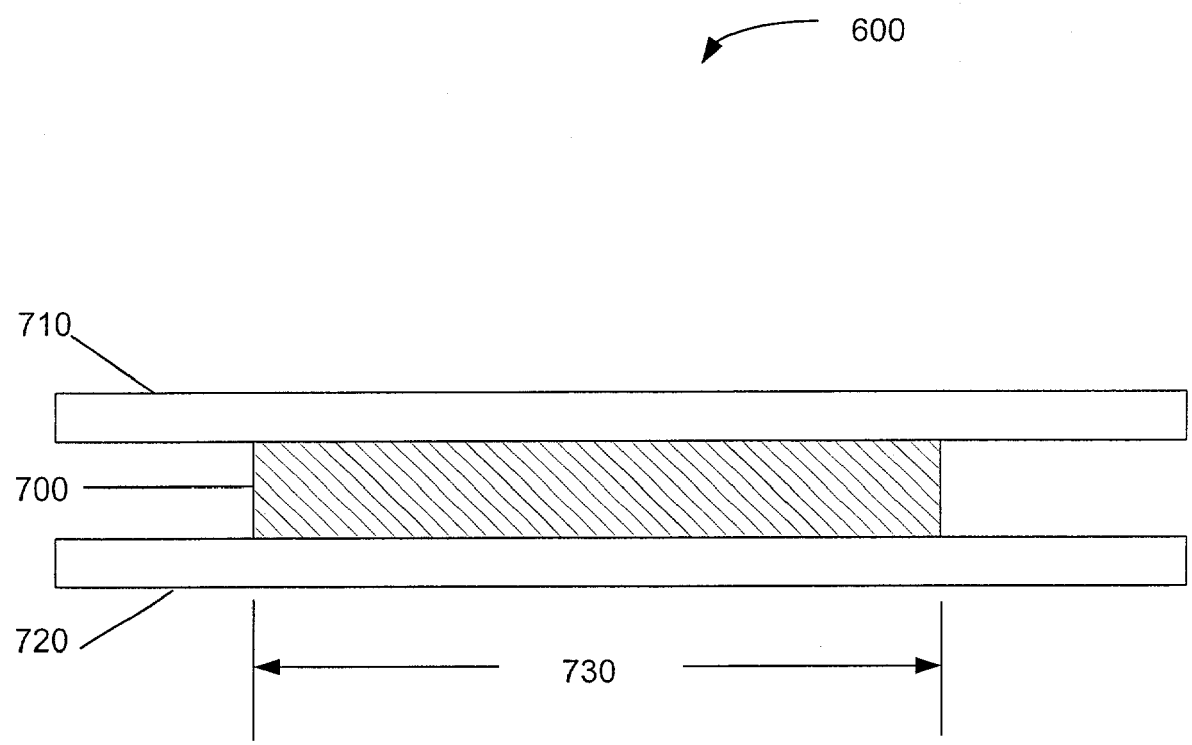
FIG. 12 illustrates a distributed tap resistor power splitter.

Referring to FIG. 12, a resistive power splitter is physically implemented with a distributed resistor 700 tapping two conducting traces 710, 720. Referring back to FIG. 5, resistor 20*a* taps two conducting traces 30*a*, 30*b*, each with characteristic impedance $Z_0$, and the resistor 20*a* has a resistance that is much larger than $Z_0$, so only a small portion of a propagating signal bilaterally transfers between the conducting traces 30*a*, 30*b*.

Returning to FIG. 12, a patterned resistive material creates a distributed resistor 700. The distributed resistor 700 is sandwiched between two conducting traces 710, 720 each having characteristic impedance $Z_0$. Similar to resistor 20*a*, shown in FIG. 5, the resistance of the distributed resistor 700 is significantly larger than $Z_0$ of the conducing traces 710, 720.

As a signal propagates through one of the conducting traces, the distributed resistor 700 taps a small portion of the signal onto the other conducting trace. For example, if a signal propagates on conducting trace 710, the distributed resistor 700 taps a portion of the signal from conducting trace 710 and passes the signal portion to the other conducting trace 720. The distributed resistor 700 is capable of bilateral signal transfers between the conducting traces 710, 720, so signals may be transferred in the opposite direction.

To ensure distributed resistor behavior, the length 730 of the distributed resistor 700 is typically larger than approximately one-tenth of the propagating signal's characteristic wavelength. The signal's wavelength may be, for example, the wavelength of the carrier frequency of a quadrature-amplitude modulated signal, the wavelength corresponding to the edge transition rate of a modulated pulse waveform, or other wavelength measure. The distributed resistor 700 may also be implemented to extend across a surface of a single circuit board layer, or extend between multiple circuit board layers, or other similar implementation.

The distributed resistor 700 may also be implemented for differential signals by forming two regions of resistive material and having one region distributed between two conducting traces and the second region distributed between companion differential conducting traces. Since total resistance may increase along the length 730, the distributed resistor 700 may provide directivity to propagating signals. The per unit length resistivity of resistor 700 may also be varied along the length 730 to further improve directivity.

Figure 13:
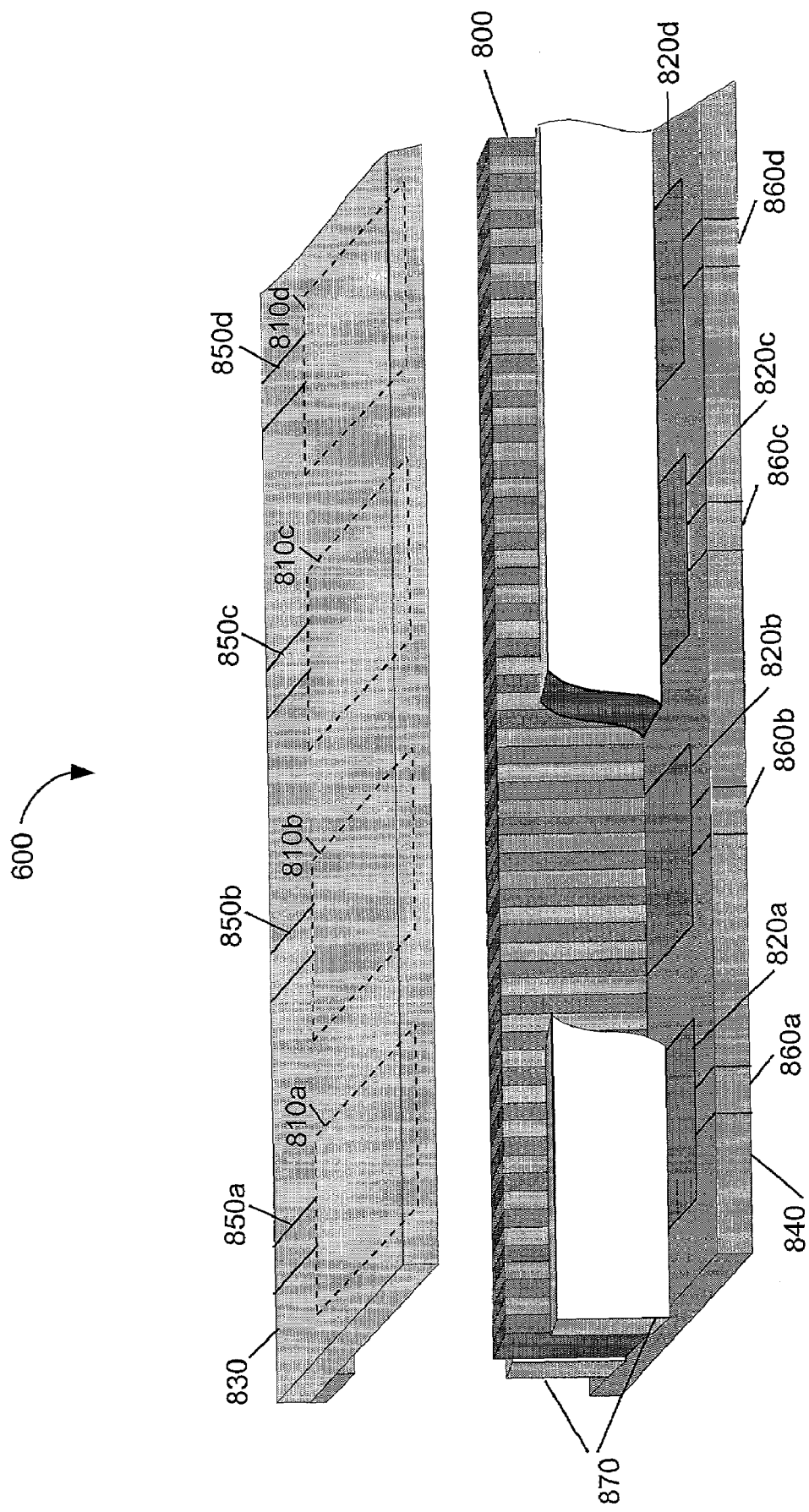
FIG. 13 illustrates an elastomer connector tap resistor power splitter.

Referring to FIG. 13, a resistive power splitter 600 includes a resistive elastomer connector 800 to provide a resistor to tap signals between metal pads 810*a–d*, positioned within printed circuit board 830, and metal pads 820*a–d*, positioned within printed circuit board 840. The metal pads 810*a–d*, 820*a–d* connect to respective conducting traces 850*a–d*, 860*a–d* which are also contained in the respective printed circuit boards 830, 840. The resistive elastomer connector 800 is inserted into a socket 870 for positioning between the printed-circuit boards 830, 840 and pressure is applied by a clamp (not shown) to ensure contact between the metal pads 810*a–d*, 820*a–d* and the resistive elastomer connector 800. The resistance of resistive elastomer connector 800 is significantly larger, similar to the resistive power splitter of FIG. 12, than the characteristic impedances of the conducting traces 850*a–d*, 860*a–d* so that the resistive power splitter 600 is suitable for high data rate communication.

In the examples discussed above in conjunction with FIGS. 1–8, CPU's 40*a–e* transmit and receive digital signals, however other digital devices may be used to transmit and receive the digital signals. For example, memory chips, graphics processors, network processors, programmable logic devices, network interface devices, flip-flops, or other similar digital devices may be used to transmit and receive digital signals. Some CPU's may also contain transceivers within their internal circuitry. So, in another example, transceivers 140*a*, 140*b*, shown in FIG. 5, may be contained within the CPU's 40*a*, 40*b*. Various devices may also be used to condition signals that are transmitted and received by the CPU's. Along with transceivers, translating buffers or similar signal conditioning devices may be connected to the CPU's to condition the signals.

Various types of conducting lines may be used within the network 10 to connect the CPU's to the resistive power splitters. Conducting traces are often used on circuit boards and multiple-layer circuit cards to connect CPU's. However, other conducting lines such as etched conductors, flex circuits, monofilament wires, cables, or similar conducting devices may be used to connect the CPU's to the resistive power splitter.

As mentioned above the resistive power splitters include resistors to split signals between the CPU's. However, capacitors, inductors, diodes or other similar device may be used to split the signals. The resistors may also be implemented as variable resistors using active devices, such as transistors, to enable reconfiguration of the resistive power splitters after manufacture. To reconfigure, the active devices may be connected or disconnected to the resistive power splitter under external control. In addition, this implementation allows the resistances to be controlled using feedback to compensate for manufacturing variations, temperature variations, or other similar deviations. The resistive power splitters may also be configured to split differential signals along with single-ended signals.

The resistive power splitters may be implemented in various structures not limited to those shown in FIGS. 9–13. Materials and fabrication methods may be utilized to easily produce low-cost resistive power splitters. For example, the resistive power splitters may be produced with resistive layers that are photo-imageable or may be patterned with photolithography and chemical etch processes. Materials such as nichrome (available from BI Technologies Corp. of Fullerton, (Calif.), tantalum nitride (available from International Resistive Company, Inc., of Corpus Christi, (Tex.), resistive pastes (available from Metech, Inc., of Elverson, (Pa.), resistive inks (available from Coates Circuit Products, of Midsomer Norton, Bath, United Kingdom), Ohmega-ply™ (available from Ohmega Technologies Inc., of Culver City, (Calif.), resistive elastomer connectors (available from Fujipoly America Corporation, of Carteret, N.J.) or other similar materials may be used to produce the resistive layers. Methods may also be used to integrate the resistive materials into low cost printed wiring boards.

As mentioned in conjunction with FIG. 8, couplers can couple a portion of the signals between conducting traces. However, other couplers such as capacitive couplers, inductive couplers, or other similar devices may be used to couple the signals between the conducting traces. Differential couplers (e.g., 8-port differential couplers) may also be used to couple differential signals to the CPU's. Each coupler structure may be physically separated, for example, into two component halves. The couplers may also be configured from stripline, microstrip, slotline, finline, coplanar waveguide structures, or similar waveguide structures.

The resistive power splitters described above may support various signaling methodologies to achieve high data rate communication. Some examples include binary digital signaling, multiple-voltage level signaling, edge- or pulse-based modulated signaling schemes, and narrowband modulated carrier schemes such as QAM, QPSK, FSK, or similar modulation techniques. For optimal communication, in terms of data rate and reliability, the signaling approach is tailored to the characteristics of the particular network embodiment.

Various types of impedances, in conjunction with FIG. 7, may terminate the conducting traces 30a–e and reduce the internal reflections of the signals within the network 10. Terminating resistors 150a–e may terminate the conducting traces 30a–e, however any type of impedance can be used for termination. For example, capacitors, inductors, diodes, or transistors may provide impedance to terminate the conducting traces. Also the capacitors, inductors, diodes, or transistors may also be used in combination with resistors to provide the terminations.

A number of examples of the invention have been described. Nevertheless, it will be understood that various modifications may be made without departing from the spirit and scope of the invention. Accordingly, other examples are within the scope of the following claims.

What is claimed is:

1. A network comprising:
first, second, and third CPU's;
a first conducting line connected to the first CPU, a second conducting line connected to the second CPU, a third conducting line connected to a third CPU;
an impedance pathway including first, second, and third resistive elements, the first resistive element connecting the first conducting line to the second conducting line, the second resistive element connecting the second conducting line to the third conducting line, the third resistive element connecting the first conducting line to the third conducting line, the first, second, and third resistive elements being connected in a delta network and having impedances so that a signal from one of the conducting lines propagating through the impedance pathway to the other two conducting lines has a lower reflection than if the three conducting lines were connected directly together.

2. The network of claim 1 in which the resistive elements having impedances such that the impedance of the impedance pathway matches the impedance of each conducting line.

3. The network of claim 1, comprising N>3 conducting lines, and the impedance pathway comprises N×(N−1)/2 resistive elements coupled to the conducting lines and connected in a delta network.

4. The network of claim 3 in which the conducting lines have equal characteristic impedances.

5. The network of claim 4 in which each of the resistive elements has a resistance of $R=(N-2) \times Z_0$, in which $Z_0$ is the characteristic impedance of the conducting lines.

6. An apparatus comprising:
a first conducting line, a second conducting line, and a third conducting line; and
an impedance pathway to couple the first, second, and third conducting lines, the impedance pathway comprises at least four resistive elements connected in a delta-network, each resistive element connecting a pair of the conducting lines, the resistive elements having impedances such that the impedance of the impedance pathway matches the impedance of each conducting line at respective points where the impedance pathway connects to the conducting line.

7. An apparatus comprising:
a first conducting line, a second conducting line, and a third conducting line; and
an impedance pathway to couple the first, second, and third conducting lines, the impedance pathway having resistive elements connected in a delta network, each resistive element connecting a pair of the conducting lines, the resistive elements having impedances such that the impedance of the impedance pathway matches the impedance of each conducting line at respective points where the impedance pathway connects to the conducting line;
wherein the at least one resistive element comprises patterned resistive material, the patterned resistive material having a length at least one-tenth of a wavelength of a signal from one of the conducting lines.

8. An apparatus comprising:
a first conducting line, a second conducting line, and a third conducting line; and
an impedance pathway to couple the first, second, and third conducting lines, the impedance pathway having resistive elements connected in a delta network, each resistive element connecting a pair of the conducting lines, the resistive elements having impedances such that the impedance of the impedance pathway matches the impedance of each conducting line at respective points where the impedance pathway connects to the conducting line;

wherein the each of the resistive elements has an impedance at least five times the impedance of the conducting lines.

9. An apparatus comprising:
a first conducting line, a second conducting line, and a third conducting line;
an impedance pathway to couple the first, second, and third conducting lines, the impedance pathway having resistive elements connected in a delta network, each resistive element connecting a pair of the conducting lines, the resistive elements having impedances such that the impedance of the impedance pathway matches the impedance of each conducting line at respective points where the impedance pathway connects to the conducting line; and
a first central processing unit coupled to the first conducting line, a second central processing unit coupled to the second conducting line, and a third central processing unit coupled to the third conducting line.

10. The apparatus of claim 9 further comprising at least one of a transmitter and a receiver coupled to one of the conducting lines.

11. An apparatus comprising:
a differential resistive power splitter comprising pairs of legs, each pair of legs coupled to a pair of conducting lines, each pair of conducting lines coupled to a device, the differential resistive power splitter to receive a differential signal from a first device, split the differential signal into at least two differential signals, and forward the at least two differential signals to at least two other devices,
in which the pairs of legs have impedances such that the differential signal has a reduced reflection when propagating from the first device to the at least two other devices than if the pairs of conducting lines were connected directly together.

12. The apparatus of claim 11 in which each pair of legs comprise legs that are insulated from each other.

13. An apparatus comprising:
a differential resistive power splitter comprising pairs of legs, each pair of legs coupled to a pair of conducting lines, each pair of conducting lines coupled to a device, the differential resistive power splitter to receive a differential signal from a first device, split the differential signal into at least two differential signals, and forward the at least two differential signals to at least two other devices,
in which the pairs of legs are connected to form a pair of Y-networks.

14. The apparatus of claim 13 in which the pairs of legs have impedances such that the impedance of the differential resistive power splitter matches the impedance of each pair of conducting lines at respective points where each pair of legs connect to the corresponding pair of conducting lines.

15. The apparatus of claim 13 in which the differential resistive power splitter comprises N pairs of legs, N>3.

16. The apparatus of claim 13 in which each pair of legs comprise legs that are insulated from each other.

17. An apparatus comprising:
a differential resistive power splitter comprising pairs of legs, each pair of legs coupled to a pair of conducting lines, each pair of conducting lines coupled to a device, the differential resistive power splitter to receive a differential signal from a first device, split the differential signal into at least two differential signals, and forward the at least two differential signals to at least two other devices,
in which the pairs of legs are connected to form a pair of delta-networks.

18. The apparatus of claim 17 in which the differential resistive power splitter comprises N×(N−1)/2 pairs of legs, N>3.

19. The apparatus of claim 17 in which each pair of legs comprise legs that are insulated from each other.

20. An apparatus comprising:
a differential resistive power splitter comprising a first impedance network and a second impedance network that are connected to pairs of conducting lines,
the first and second impedance networks to split an incoming differential signal propagating on one of the pairs of conducting lines into multiple outgoing differential signals propagating on other pairs of the conducting lines, each of the first and second impedance networks comprising resistive components electrically coupled by connecting lines,
in which at least one of the resistive components of the first impedance network crosses over a connecting line of the second impedance network without electrically contacting the connecting line.

21. The apparatus of claim 20 in which each of the resistive components of the first impedance networks crosses over one of the connecting lines of the second impedance network without electrically contacting the connecting line.

22. The apparatus of claim 20 in which the connecting lines of the first impedance network form a closed loop.

23. The apparatus of claim 22 in which the connecting lines of the second impedance network also form a closed loop.

24. The apparatus of claim 20 in which none of the resistive components overlap another resistive component.

25. The apparatus of claim 20 in which each of the first and second impedance networks comprises a Y-network.

26. The apparatus of claim 20 in which each of the first and second impedance networks comprises a delta-network.

27. A method comprising:
connecting a first conducting line to a first electronic component;
connecting a second conducting line to a second electronic component;
connecting a third conducting line to a third electronic component;
connecting an impedance pathway to the first, second, and third conducting lines, the impedance pathway having resistive elements connected in a delta network, each resistive element connecting a pair of the conducting lines, the resistive elements having impedances such that the impedance of the impedance pathway matches the impedance of each conducting line at respective points where the impedance pathway connects to the conducting line; and
stacking resistive elements in the impedance pathway network.

28. A method comprising:
connecting a first conducting line to a first electronic component;
connecting a second conducting line to a second electronic component;

connecting a third conducting line to a third electronic component;

connecting an impedance pathway to the first, second, and third conducting lines, the impedance pathway having resistive elements connected in a delta network, each resistive element connecting a pair of the conducting lines, the resistive elements having impedances such that the impedance of the impedance pathway matches the impedance of each conducting line at respective points where the impedance pathway connects to the conducting line; and mounting at least one resistive element over at least one conducting line.

29. The method of claim 28, in which mounting at least one resistive element over at least one conducting line comprises mounting each of the resistive elements over a corresponding conducting line.

30. A method comprising:

transferring electrical signals from a first conducting line through an impedance pathway to a second conducting line and a third conducting line, the impedance pathway having resistive elements connected in a delta network, the resistive elements having impedances such that the impedance of the impedance pathway matches the impedance of each conducting line at respective points where the impedance pathway connects to the conducting line, wherein transferring electrical signals comprises transmitting the electrical signals at a first data rate that is higher than a second data rate, in which the second data rate is the highest possible data rate for transmitting the electrical signals if the first conducting line were connected to the second conducting line directly.

31. A method comprising:

transmitting a differential signal from a first pair of conducting lines through a differential resistive power splitter to at least a first pair of conducting lines and a second pair of conducting lines, the differential resistive power splitter comprising pairs of legs each connected to one of the pairs of conducting lines and having impedances such that the impedance of the differential resistive power splitter matches the impedance of each pair of conducting lines at respective points where the differential resistive power splitter connects to the pair of conducting lines, in which the pairs of legs are connected to form a pair of Y-networks.

32. The method of claim 31 in which the differential signal comprises a first signal and a second signal, and transmitting the differential signal through the first pair of conducting lines comprises transmitting the first signal from an electronic device to the power splitter through one of the first pair of conducting lines, and transmitting the second signal from the electronic device to the power splitter through another of the first pair of conducting lines.

33. The apparatus of claim 31 in which each pair of legs comprise legs that are insulated from each other.

34. A method comprising:

transmitting a differential signal from a first pair of conducting lines through a differential resistive power splitter to at least a first pair of conducting lines and a second pair of conducting lines, the differential resistive power splitter comprising pairs of legs each connected to one of the pairs of conducting lines and having impedances such that the impedance of the differential resistive power splitter matches the impedance of each pair of conducting lines at respective points where the differential resistive power splitter connects to the pair of conducting lines, in which the pairs of legs are connected to form a pair of delta-networks.

35. The method of claim 34 in which the differential signal comprises a first signal and a second signal, and transmitting the differential signal through the first pair of conducting lines comprises transmitting the first signal from an electronic device to the power splitter through one of the first pair of conducting lines, and transmitting the second signal from the electronic device to the power splitter through another of the first pair of conducting lines.

36. The apparatus of claim 34 in which each pair of legs comprise legs that are insulated from each other.

* * * * *

UNITED STATES PATENT AND TRADEMARK OFFICE
CERTIFICATE OF CORRECTION

PATENT NO. : 7,199,681 B2 Page 1 of 1
APPLICATION NO. : 10/126754
DATED : April 3, 2007
INVENTOR(S) : Rajeevan Amirtharajah et al.

It is certified that error appears in the above-identified patent and that said Letters Patent is hereby corrected as shown below:

Column 12:
Line 31, Claim 5, "N=2" should be --N-2--.

Signed and Sealed this

Fourteenth Day of August, 2007

JON W. DUDAS
*Director of the United States Patent and Trademark Office*